(12) United States Patent
Naruse et al.

(10) Patent No.: US 6,317,457 B1
(45) Date of Patent: Nov. 13, 2001

(54) PULSE DENSITY MODULATOR

(75) Inventors: Tetsuya Naruse, Chiba; Satoshi Konya, Kanagawa, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/264,244

(22) Filed: Mar. 8, 1999

(30) Foreign Application Priority Data

Mar. 13, 1998 (JP) .................................................. 10-063457

(51) Int. Cl.$^7$ ....................................................... H03K 7/00
(52) U.S. Cl. ...................... 375/237; 375/238; 375/239; 375/354; 332/112; 332/127
(58) Field of Search ..................................... 375/237, 238, 375/239, 354, 355; 332/112, 115, 124, 126, 127

(56) References Cited

U.S. PATENT DOCUMENTS

| | | | |
|---|---|---|---|
| 5,204,635 | * 4/1993 | Takeuchi | 329/336 |
| 5,224,125 | * 6/1993 | Wong et al. | 375/82 |
| 5,995,546 | * 11/1999 | Richardson | 375/237 |
| 6,009,007 | * 12/1999 | Pan | 363/98 |
| 6,014,417 | * 1/2000 | Hee et al. | 375/374 |

* cited by examiner

Primary Examiner—Stephen Chin
Assistant Examiner—Dac V. Ha
(74) Attorney, Agent, or Firm—Jay H. Maioli

(57) ABSTRACT

A pulse density modulator for performing a modulation process by changing a pulse density per unit time. The pulse density modulator includes a counting circuit for counting supplied clock signals, a first waveform data generating circuit for synthesizing count data outputted from the counting circuit to generate basic waveform data, a second waveform data generating circuit for synthesizing the basic waveform data outputted from the first waveform data generating circuit to generate pulse density modulated waveform data corresponding to digital data supplied externally, a clock correction signal generating circuit for generating a clock correction signal indicating the phase of an unequal cycle component included in the clock signals, and a waveform data correcting circuit for correcting the pulse density modulated waveform data based on the clock correction signal. Since the waveform data correcting circuit is provided for correcting the pulse density modulated waveform data based on the clock correction signal indicating the phase of the unequal cycle component included in the clock signal, the linearity can be achieved between the corrected pulse density modulated waveform data and its direct current component only by adding the waveform data correcting circuit.

6 Claims, 14 Drawing Sheets

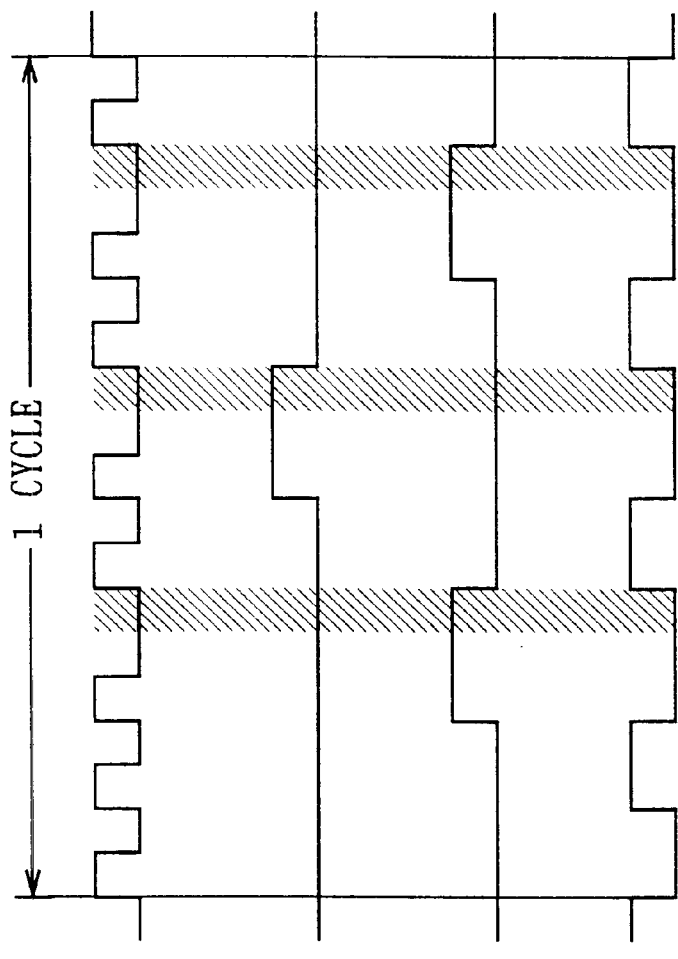
FIG. 6A (PRIOR ART) S7
FIG. 6B (PRIOR ART) SB0
FIG. 6C (PRIOR ART) SB1
FIG. 6D (PRIOR ART) SB2

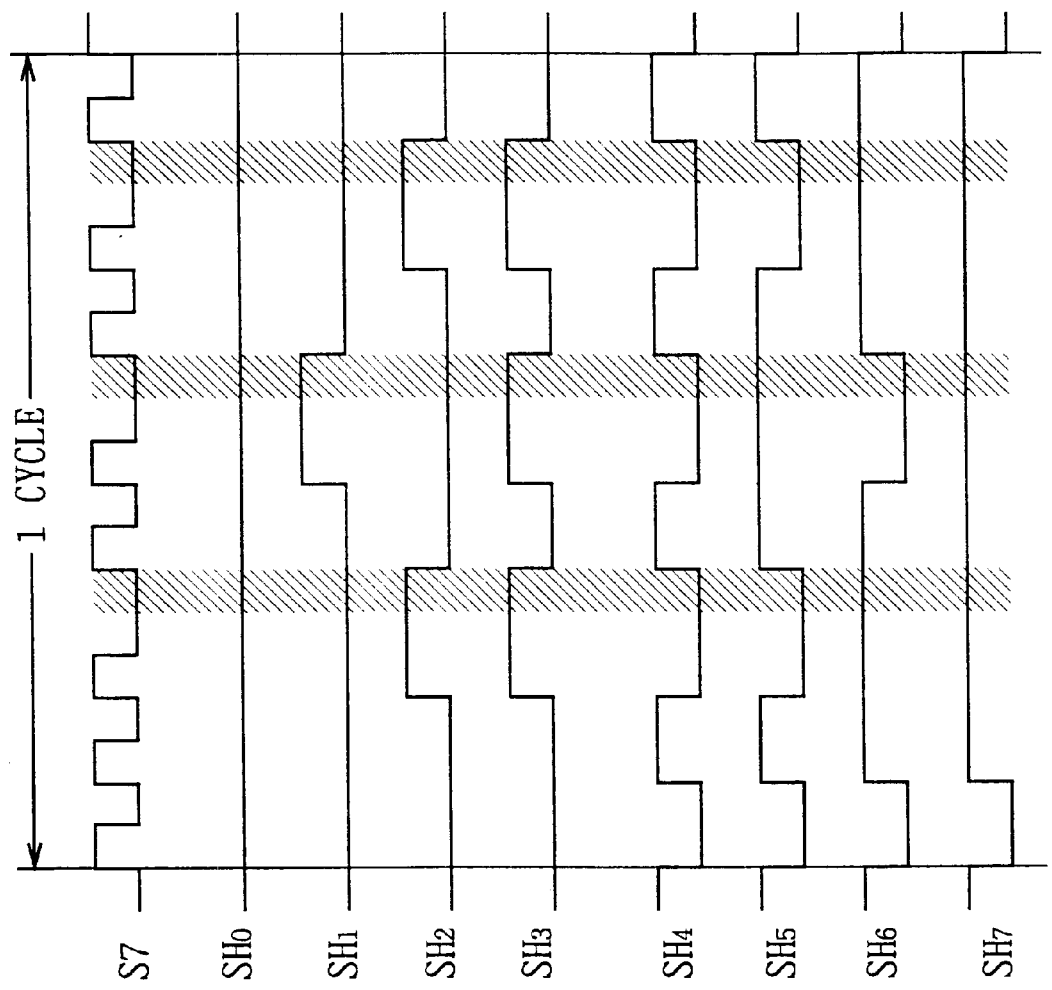

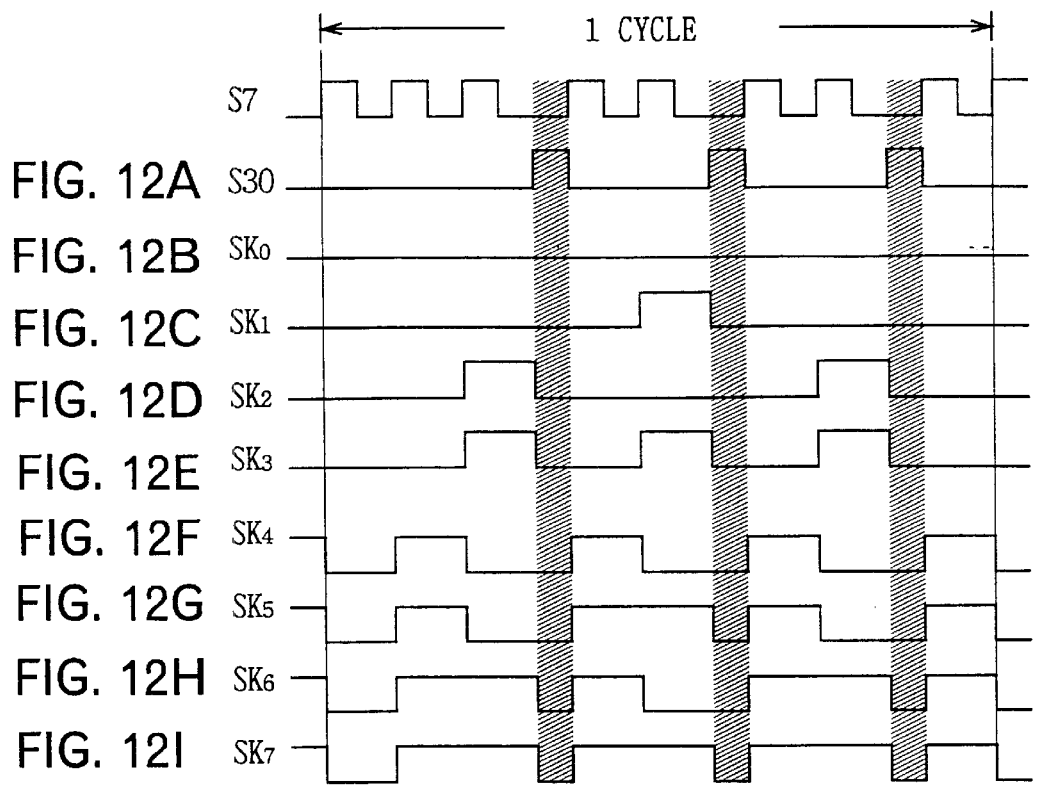
FIG. 12A S30
FIG. 12B SK0
FIG. 12C SK1
FIG. 12D SK2
FIG. 12E SK3
FIG. 12F SK4
FIG. 12G SK5
FIG. 12H SK6
FIG. 12I SK7
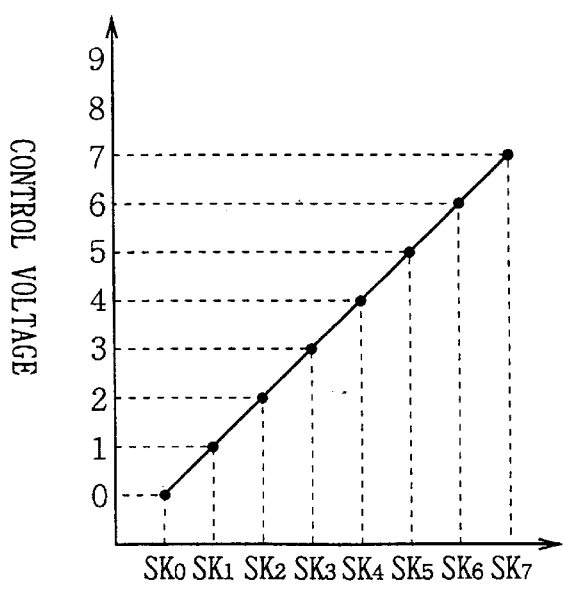
PDM WAVEFORM CORRECTION DATA
FIG. 13

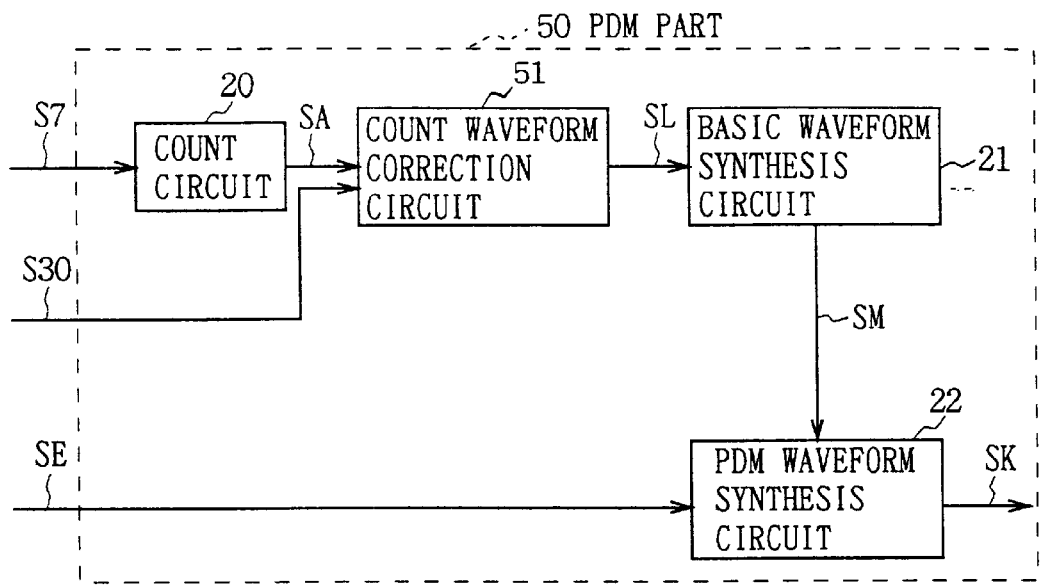
FIG. 14
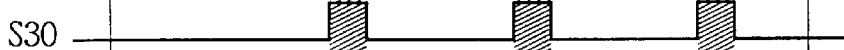
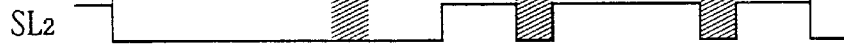
FIG. 15A S7
FIG. 15B S30
FIG. 15C SL0
FIG. 15D SL1
FIG. 15E SL2

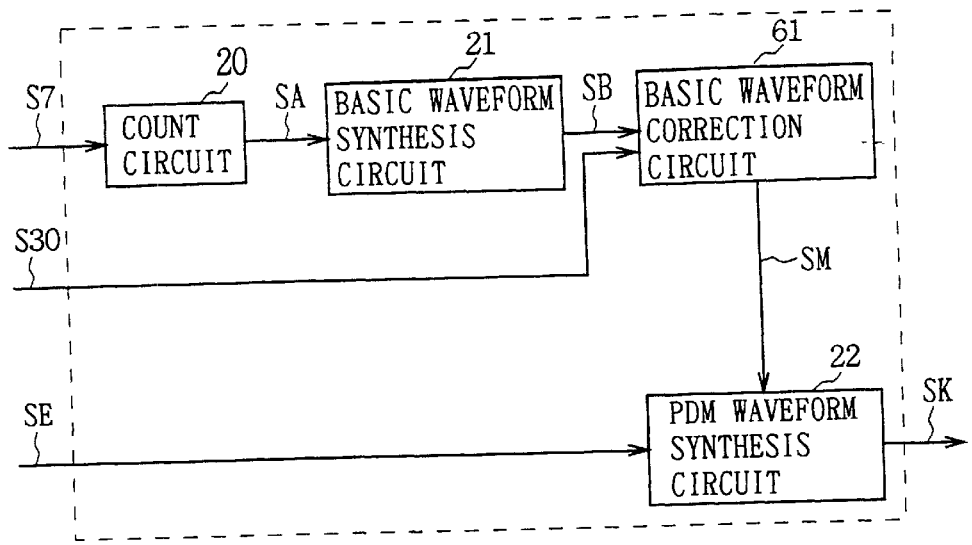
FIG. 16
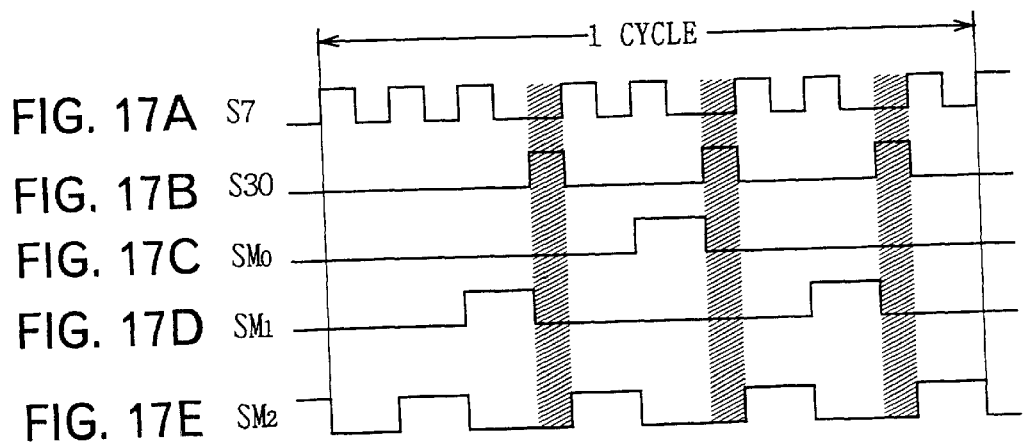
FIG. 17A S7
FIG. 17B S30
FIG. 17C SM0
FIG. 17D SM1
FIG. 17E SM2

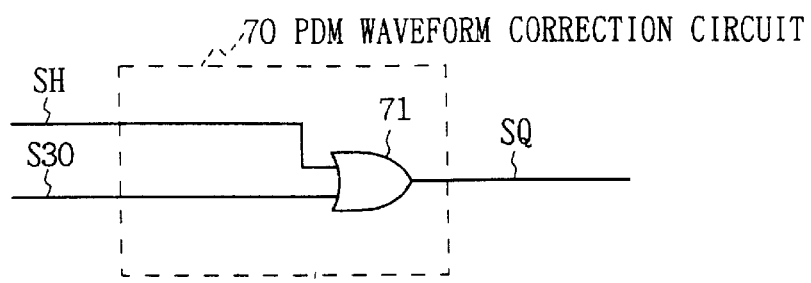
FIG. 18
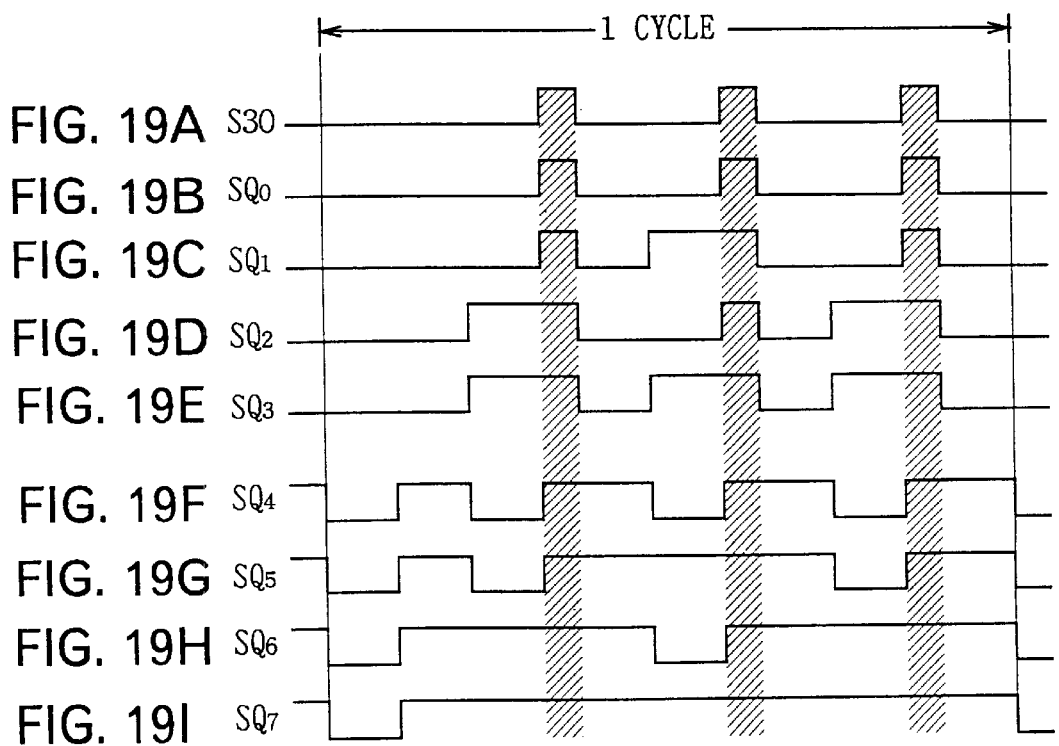
FIG. 19A S30
FIG. 19B SQ0
FIG. 19C SQ1
FIG. 19D SQ2
FIG. 19E SQ3
FIG. 19F SQ4
FIG. 19G SQ5
FIG. 19H SQ6
FIG. 19I SQ7

PULSE DENSITY MODULATOR

BACKGROUND OF THE INVENTION

1. Field of the Invention

The present invention relates to a pulse density modulator, and more particularly, to a pulse density modulation (PDM) device employed in a portable telephone.

2. Description of the Related Art

There has been proposed a PDM device which performs a modulation process by changing a pulse density per unit time. This PDM device is provided in order to adjust the frequency of a pseudo noise (PN) code generated in a reception side of, for instance, a portable telephone of the code division multiple access (CDMA) system. By employing FIG. 1, the circuit constitution of a receiving system in such a portable telephone will be specifically described as follows.

A portable telephone 1 receives a transmission signal which is subjected to a spread spectrum modulation with a pseudo noise code and then transmitted, through an antenna 2, and inputs a reception signal S1 to a reception part 3. The reception part 3 performs a prescribed signal process such as a frequency conversion on the reception signal S1, and outputs a reception signal S2 thus obtained to a multiplier 4.

The multiplier 4 multiplies the reception signal S2 by a pseudo noise (PN) code S3 supplied from a pseudo noise (PN) code generator 5 (that is, an exclusive OR operation) in order to perform an inverse diffusion, and outputs a reception signal S4 thus obtained to a decoding part 6 and a frequency error correction block 7. The decoding part 6 performs a decoding process on the reception signal S4 in order to generate a baseband signal S5 and outputs the baseband signal S5 to a subsequent circuit (not shown).

The frequency error correction block 7 is designed to input the reception signal S4 to a frequency error detection part 8. The frequency error detection part 8 detects a frequency error between the reception signal S2 and the PN code S3 on the basis of the reception signal S4 which has been multiplied by the PN code S3, and outputs the resultant frequency error as frequency error data SE to a PDM part 9 corresponding to the above-described PDM device. The PDM part 9 performs a pulse density modulation on the frequency error data SE based on a clock signal S7 supplied from a frequency divider 10 in order to generate PDM waveform data SH, and outputs the PDM waveform data SH to a low-pass filter (LPF) 11.

The LPF 11 extracts a direct current component from the PDM waveform data SH to generate control voltage S9 and outputs the control voltage S9 to a voltage control crystal oscillator (VCXO) 12. The VCXO 12 generates a transmission signal S10 while changing a transmission frequency in accordance with the control voltage S9 supplied, and outputs the transmission signal S10 to the frequency divider 10. The frequency divider 10 divides the frequency of the transmission signal S10 in accordance with a predetermined number of frequency divisions so as to generate a clock signal S7, and outputs the clock signal S7 to the PN code generator 5 and the PDM part 9. The PN code generator 5 generates the PN code S3 based on the clock signal S7 supplied from the frequency divider 10 and outputs the PN code S3 to the multiplier 4.

The frequency error correction block 7 generates the clock signal S7 based on the reception signal S4 multiplied by the PN code S3, and supplies the clock signal S7 to the PN code generator 5. Thereby, the frequency of the PN code S3 generated in the PN code generator 5 is controlled so as to correspond to the frequency of the PN code at a transmission side included in the reception signal S2.

As illustrated in FIG. 2, the PDM part 9 comprises a count circuit 20, a basic waveform synthesis circuit 21 and a PDM waveform synthesis circuit 22. The PDM part 9 is designed to input the clock signal S7 supplied from the frequency divider 10 (FIG. 1) to the count circuit 20. The count circuit 20 composed of a binary count circuit of "n" bits, counts the clock signal S7 to generate count data SA of "n" bits and outputs the count data SA to the basic waveform synthesis circuit 21. In this case, the cycle of each bit forming the count data SA is composed of multiples of the cycle of the clock signal S7.

As shown in FIG. 3, the basic waveform synthesis circuit 21 outputs the least significant bit (LSB) data $SA_0$ of the supplied count data SA of "n" bits as the most significant bit (MSB) data $SB_{n-1}$ of basic waveform data to the PDM waveform synthesis circuit 22 as it is, while inputting the bit data $SA_0$ to an inverter $A_0$. Further, the basic waveform synthesis circuit 21 inputs bit data $SA_1$ of a column one bit higher than the least significant bit of the count data SA, to an AND circuit $B_1$ and an inverter $A_1$. In the same way, the basic waveform synthesis circuit 21 is designed to input bit of the bit data SA to the corresponding AND circuits B and inverters A. In this connection, the basic waveform synthesis circuit 21 inputs the most significant bit data $SA_{n-1}$ of the count data SA to an AND circuit $B_{n-1}$.

The inverter $A_0$ inverts the polarity of the bit data $SA_0$ and outputs inverter output data $SC_0$ thus obtained to the AND circuit $B_1$ and an AND circuit $C_1$. Further, the inverter $A_1$ inverts the polarity of the bit data $SA_1$ and outputs inverter output data $SC_1$ thus obtained to the AND circuit $C_1$. In the same way, the inverter A afterward inverts the polarity of the bit data SA and outputs inverter output data SC thus obtained to corresponding AND circuits C.

The AND circuit $C_1$ takes the AND of the inverter output data $SC_0$ obtained by inverting the polarity of the count data $SA_0$ of the least significant bit and the inverter output data $SC_1$ obtained by inverting the polarity of the bit data $SA_1$ of a column one bit higher than the least significant bit, and then outputs AND output data $SD_1$ thus obtained to an AND circuit $B_2$ and an AND circuit $C_2$ (not shown). In the same way, the AND circuit C afterward takes the AND of AND output data SD outputted from the AND circuit C of a column one bit lower than that of it and inverter output data SC outputted from the inverter A, and then outputs AND output data SD thus obtained to the AND circuit B and the AND circuit C of a column one bit higher than that of it. In this connection, an AND circuit $C_{n-2}$ takes the AND of AND output data $SD_{n-3}$ outputted from an AND circuit $C_{n-3}$ and inverter output data $SC_{n-2}$ outputted from an inverter $A_{n-2}$, and outputs AND output data $SD_{n-2}$ thus obtained to the AND circuit $B_{n-1}$.

The AND circuit $B_1$ takes the AND of the inverter output data $SC_0$ and the bit data $SA_1$, and outputs the computed result to the PDM waveform synthesis circuit 22 as bit data $SB_{n-2}$ of a column one bit lower than the most significant bit of the basic waveform data. In addition, the AND circuit $B_2$ takes the AND of the AND output data $SD_1$ and count data $SA_2$, and outputs the computed result to the PDM waveform synthesis circuit 22 as bit data $SB_{n-3}$ of a column two bits lower than the most significant bit. In such a way, the AND circuit B takes the AND of the AND output data SD and the count data SA, and outputs the computed result to the PDM waveform synthesis circuit 22 as basic waveform data SB of a desired column.

As shown in FIG. 4, the PDM waveform synthesis circuit 22 inputs the the least significant bit data $SB_0$ of the basic waveform data SB to an AND circuit $D_0$, and inputs the bit data $SB_1$ of a column one bit higher than the least significant bit to an AND circuit $D_1$. In this manner, the PDM waveform synthesis circuit 22 inputs the bits of the basic waveform data SB to corresponding AND circuits D.

The PDM waveform synthesis circuit 22 is supplied the frequency error data SE from the frequency error detection part 8. The PDM waveform synthesis circuit 22 inputs the least significant bit data $SE_0$ of the frequency error data SE to the AND circuit $D_0$, and inputs bit data $SE_1$ of a column one bit higher than the least significant bit to the AND circuit $D_1$. In the same way, the PDM waveform synthesis circuit 22 afterward inputs the frequency error data SE to the corresponding AND circuits D.

The AND circuit $D_0$ takes the AND of the least significant bit data $SB_0$ of the basic waveform data SB and the bit data $SE_0$ of the frequency error data SE, and outputs AND output data $SF_0$ to an OR circuit $E_0$. On the other hand, the AND circuit $D_1$ takes the AND of the bit data $SB_1$ of a column one bit higher than the least significant bit and the bit data $SE_1$, and outputs AND output data $SF_1$ thus obtained to the OR circuit $E_0$. In the same way, the AND circuit D afterward takes the AND of bit data of a desired column of the basic waveform data SB and bit data of the frequency error data SE, and outputs AND output data SF thus obtained to the corresponding OR circuits E.

The OR circuit $E_0$ takes the OR of the AND output data $SF_0$ obtained from the AND of the least significant bits and the AND output data $SF_1$ obtained from the AND of the columns one bit higher than the least significant bits, and outputs OR output data $SG_0$ thus obtained to an OR circuit $E_1$. The OR circuit $E_1$ takes the OR of the OR output data $SG_0$ and AND output data $SF_2$ outputted from an AND circuit $D_2$ (not shown), and outputs OR output data $SG_1$ thus obtained to an OR circuit $E_2$ (not shown). In the same way, the OR circuit E takes the OR of OR output data SG outputted from the OR circuit E of a one bit lower column and the AND output data SF, and outputs OR output data SG thus obtained to an OR circuit E of a one bit higher column. In such a way, the PDM waveform synthesis circuit 22 takes the AND of the basic waveform data SB and the frequency error data SE, takes the OR of the AND output data SF thus obtained so as to generate the PDM waveform data SH, and outputs the PDM waveform data SH to the LPF 11 (FIG. 1).

In the portable telephone 1, the frequency of the transmission signal S10 generated in the VCXO 12 is divided according to a predetermined number of frequency divisions so that the clock signal S7 is generated for controlling a digital processing system circuit such as the PDM part 9. Further, the frequency of the transmission signal S10 is divided according to a different number of frequency divisions so that a clock signal is generated for controlling an analog processing system circuit such as the reception part 3. Therefore, it is desirable that the frequency of the transmission signal S10 generated in the VCXO 12 is selected so as to be the least common multiple of the frequency of the clock signal S7 employed in the digital processing system circuit and the frequency of the clock signal employed in the analog processing system circuit.

However, when it is intended to form a transmission signal having the frequency of the least common multiple of the frequency of the clock signal S7 employed in the digital processing system circuit and the frequency of the clock signal employed in the analog processing system circuit, a transmission signal having the very high frequency needs to be generated. In practice, it is extremely difficult to generate such a transmission signal. Accordingly, the VCXO 12 is designed to generate, for example, the transmission signal S10 which has a predetermined times as high a frequency as the frequency of the clock signal employed in the analog processing system circuit. Therefore, it is possible that the frequency of the transmission signal S10 is not a multiple of the frequency of the clock signal used in the digital processing system circuit. Accordingly, since the frequency divider 10 cannot divide the frequency of the transmission signal S10 according to the same by an equal cycle (hereinafter, referred to as an equal frequency division), it is possible that the frequency divider 10 cannot help generating the clock signal S7 including a clock whose cycle is different from that of other clocks (hereinafter, referred to as an unequal cycle component).

Thus, referring to FIGS. 5 to 8, a case in which the clock signal S7 including the unequal cycle component is inputted to the PDM part 9 is explained. For instance, as illustrated in FIG. 5A, it is assumed that the clock signal S7 to be inputted to the count circuit 20 of "3" bits is slowed before the rise timings of the "fourth", the "sixth" and the "eighth" clocks of its "one" cycle.

The count circuit 20 counts up the clocks synchronizing with the rise timing of the clock so as to generate the count data SA of "3" bits, and outputs the count data SA to the basic waveform synthesis circuit 21. At this time, the count circuit 20 counts up the clock signal S7 so as to generate the least significant bit data $SA_0$ which is obtained by applying a "1/2" frequency division to the frequency of the clock signal S7 (FIG. 5B). Further, the count circuit 20 generates the bit data $SA_1$ of a column one bit higher than the least significant bit (FIG. 5C), which is obtained by applying a "1/4" frequency division to the frequency of the clock signal S7. Further, the count circuit 20 generates the bit data $SA_2$ of the most significant bit which is obtained by applying a "1/8" frequency division to the frequency of the clock signal S7 (FIG. 5D).

Subsequently, referring to FIGS. 6A to 6D, the basic waveform data $SB_0$ to $SB_2$ outputted from the basic waveform synthesis circuit 21 is explained. First of all, FIG. 6A shows the clock signal S7 inputted to the count circuit 20. The basic waveform synthesis circuit 21 generates the least significant bit data $SB_0$ which indicates a logical level "H" in the phase where the bit data $SA_2$ of the count data SA indicates the logical level "H" and the bit data $SA_0$ and $SA_1$ indicate a logical level "L". Then, the basic waveform synthesis circuit 21 outputs the bit data $SB_0$ to the PDM waveform synthesis circuit 22 (FIG. 6B).

In addition, the basic waveform synthesis circuit 21 generates the bit data $SB_1$ of a column one bit higher than the least significant bit which indicates the logical level "H" in the phase where the bit data $SA_1$ indicates the logical level "H" and the bit data $SA_0$ indicates the logical level "L". Then, the basic waveform synthesis circuit 21 outputs the bit data $SB_1$ to the PDM waveform synthesis circuit 22 (FIG. 6C). Further, the basic waveform synthesis circuit 21 directly outputs the count data $SA_0$ to the PDM waveform synthesis circuit 22 as the basic waveform data $SB_2$ of the most significant bit as it is (FIG. 6D).

The time ratio of the logical level "H" and the logical level "L" in the basic waveform data SB generated in such a manner is "3/19" in the case of the least significant bit data $SB_0$ of the basic waveform data SB. In the case of the bit data $SB_1$ of a column one bit higher than the least significant bit, the time ratio is "6/19". In the case of the bit data $SB_2$ of the most significant bit, the time ratio is "8/19". Note that, phases of the bit data $SB_0$ to $SB_2$ are not superposed in the logical level "H" each other.

Next, referring to FIGS. 7A to 7I, the PDM waveform data SR outputted from the PDM waveform synthesis circuit 22 is explained. First of all, FIG. 7A shows the clock signal S7 inputted to the count circuit 20. The PDM waveform synthesis circuit 22 takes the AND of the frequency error data SE supplied from the frequency error detection part 8 and the basic waveform data SB, then takes the OR thereof to generate the PDM waveform data SH and outputs the PDM waveform data SH to the LPF 11 (FIG. 1).

When the frequency error data SE is "000", the PDM waveform synthesis circuit 22 outputs a logical level "0" as PDM waveform data $SH_0$ of a waveform number "0" (FIG. 7B). Further, when the frequency error data SE is "001", the PDM waveform synthesis circuit 22 outputs the least significant bit data $SB_0$ to the LPF 11 (FIG. 1) as PDM waveform data $SH_1$ of a waveform number "1" (FIG. 7C). Furthermore, when the frequency error data SE is "010", the PDM waveform synthesis circuit 22 outputs the basic waveform synthetic data $SB_1$ of a column one bit higher than the least significant bit as PDM waveform data $SH_2$ of a waveform number "2" (FIG. 7D).

In the next place, when the frequency error data SE is "011", the PDM waveform synthesis circuit 22 synthesizes the least significant bit data $SB_0$ of the basic waveform synthetic data and the bit data $SB_1$ of a column one bit higher than the least significant bit and then outputs data thus obtained as PDM waveform data $SH_3$ of a waveform number "3" (FIG. 7E). Further, when the frequency error data SE is "100", the PDM waveform synthesis circuit 22 outputs the most significant bit data $SB_2$ as PDM waveform data $SH_4$ of a waveform number "4" (FIG. 7F). Furthermore, when the frequency error data SE is "101", the PDM waveform synthesis circuit 22 synthesizes the least significant bit data $SB_0$ and the most significant bit data $SB_2$ and then outputs data thus obtained as PDM waveform data $SH_5$ of a waveform number "5" (FIG. 7G).

Similarly, when the frequency error data SE is "110", the PDM waveform synthesis circuit 22 synthesizes the bit data $SB_1$ of a column one bit higher than the least significant bit and the most significant bit data $SB_2$ and then outputs data thus obtained as PDM waveform data $SH_6$ of a waveform number "6" (FIG. 7H). Further, when the frequency error data SE is "111", the PDM waveform synthesis circuit 22 completely synthesizes the bit data $SB_0$, the bit data $SB_1$ and the bit data $SB_2$ of the basic waveform synthetic data SB and then outputs data thus obtained as PDM waveform data $SH_7$ of a waveform number "7" (FIG. 7I).

The LPF 11 extracts the direct current component from the PDM waveform data SH generated in the PDM part 9, and thereby generates the control voltage S9 of a desired voltage level corresponding to the PDM waveform data SH and outputs the control voltage to the VCXO 12.

Now, the relation between the PDM waveform data SH and the control voltage S9 is explained with reference to FIG. 8. The control voltage S9 increases linearly within a range of the PDM waveform data $SH_0$ to $SH_3$ of the waveform numbers "0" to "3". At the time of the PDM waveform data $SH_4$ of the waveform number "4", the control voltage S9 temporarily decreases. After that, the control voltage S9 increases linearly within a range of the PDM waveform data $SH_4$ to $SH_7$ of the waveform numbers "4" to "7" again. That is to say, the control voltage S9 increases linearly until the frequency error data SE undergoes an increment to "011", starting from "000". However, when the frequency error data SE undergoes an increment process to "100", the control voltage S9 decreases temporarily. The control voltage S9 apparently increases again until the frequency error data SE is subjected to the increment process from "100" to "111".

As mentioned above, when the clock signal S7 including the unequal cycle component is supplied to the PDM part 9, since the linearity is not established between the waveform number of the PDM waveform data SH and the control voltage S9, there is a problem that the VCXO 12 can not be controlled with accuracy.

SUMMARY OF THE INVENTION

In view of the foregoing, an object of this invention is to provide a pulse density modulator capable of performing a pulse density modulation more accurately than a conventional device.

The foregoing object and other objects of the invention have been achieved by the provision of a pulse density modulator for performing a modulation process by changing a pulse density per unit time. The pulse density modulator comprises: counting means for counting supplied clock signals; first waveform data generating means for synthesizing count data outputted from the counting means to generate basic waveform data; second waveform data generating means for synthesizing the basic waveform data outputted from the first waveform data generating means so as to generate pulse density modulated waveform data corresponding to digital data supplied externally; clock correction signal generating means for generating a clock correction signal indicating the phase of an unequal cycle component included in the clock signals; and waveform data correcting means for correcting the pulse density modulated waveform data based on the clock correction signal.

Since the waveform data correcting means is provided for correcting the pulse density modulated waveform data based on the clock correction signal indicating the phase of the unequal cycle component included in the clock signal, the linearity can be achieved between the corrected pulse density modulated waveform data and its direct current component only by adding the waveform data correcting means.

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 6A to 6D are charts showing the relation between the clock signal and basic waveform data;

FIGS. 7A to 7I are charts showing the relation between the clock signal and PDM waveform data;

FIGS. 12A to 12I are timing charts showing the relation between a clock correction signal and PDM waveform correction data;

FIG. 13 is a chart showing the relation between the PDM waveform correction data and control voltage;

FIG. 14 is a block diagram showing the constitution of a PDM part of another embodiment;

FIGS. 15A to 15E are timing charts showing the relation between the clock correction signal and count waveform correction data;

FIG. 16 is a block diagram showing the constitution of a PDM part of another embodiment;

FIGS. 17A to 17E are timing charts showing the relation between the clock correction signal and basic waveform correction data;

FIG. 18 is a block diagram showing the constitution of a PDM waveform correction circuit of another embodiment;

FIGS. 19A to 19I are timing charts showing the relation between the clock correction signal and PDM waveform correction data.

DETAILED DESCRIPTION OF THE EMBODIMENT

Figure 1:
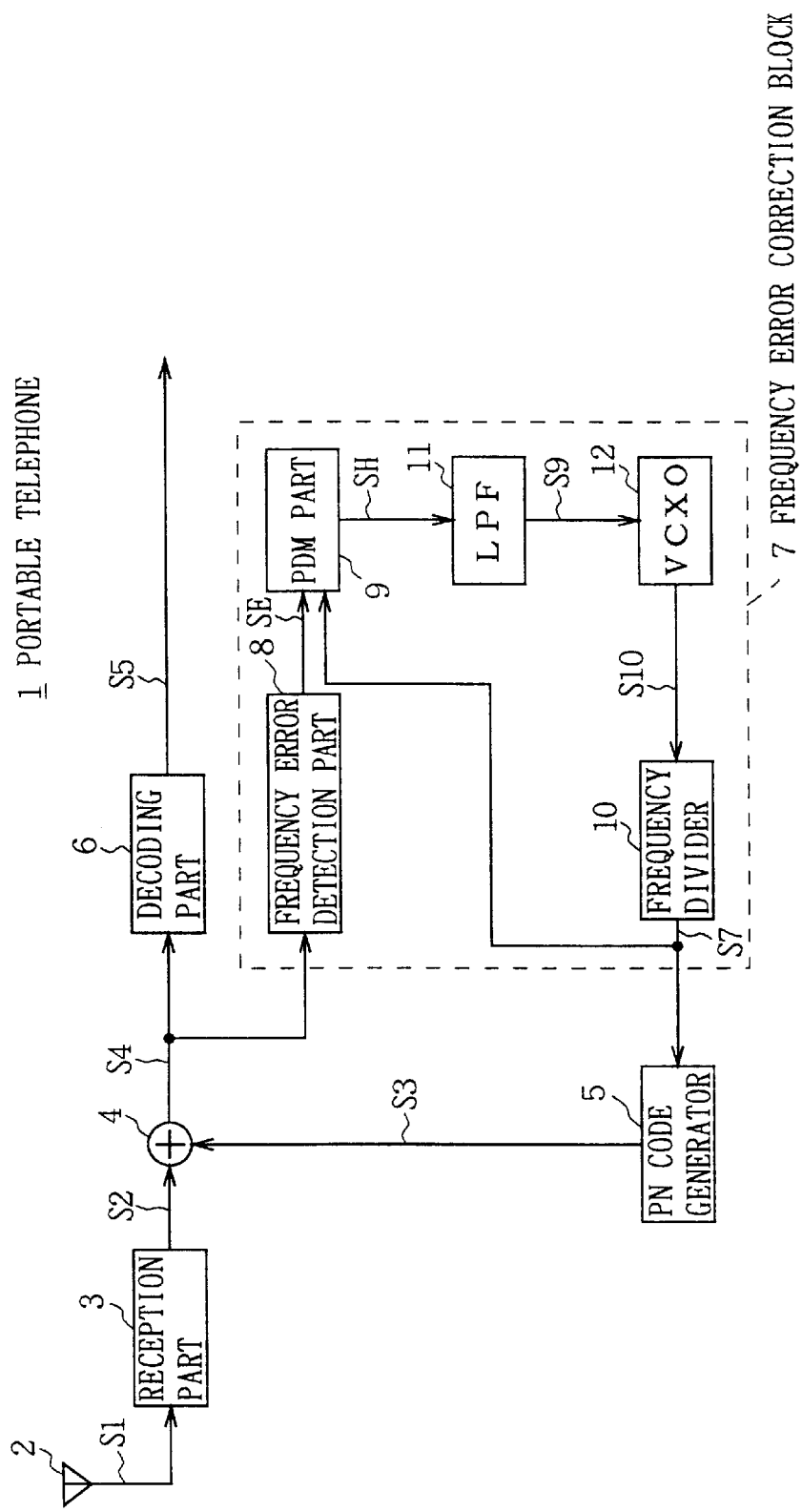
FIG. 1 is a block diagram showing the constitution of a receiving system circuit in a conventional portable telephone.
Figure 9:
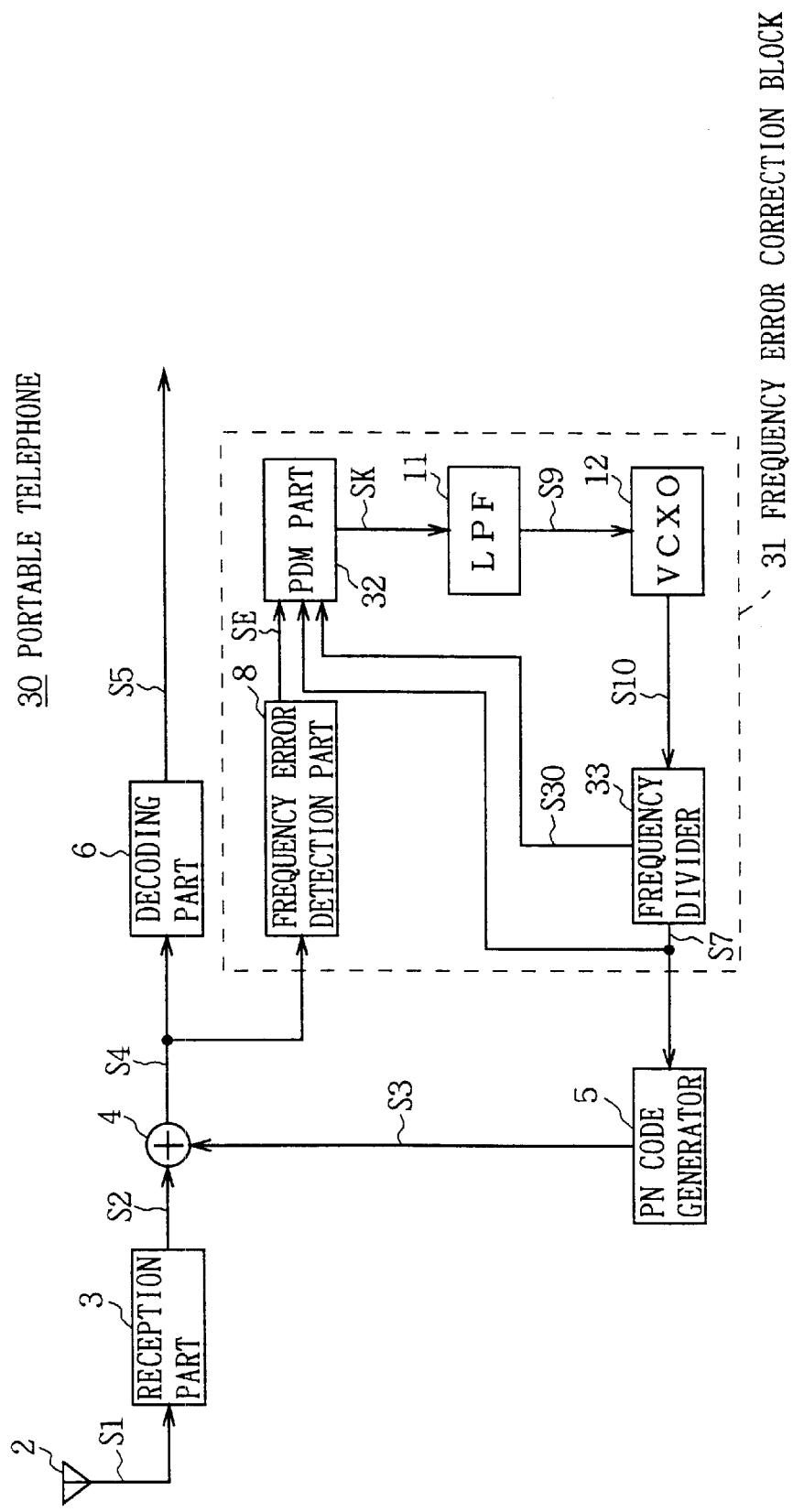
FIG. 9 is a block diagram showing the constitution of a receiving system circuit of a portable telephone according to an embodiment of the present invention.

Preferred embodiments of the present invention will be described with reference to the accompanying drawings:

In FIG. 9 in which parts corresponding to those in FIG. 1 are denoted by the same reference numerals as those in FIG. 1, 30 generally denotes a portable telephone which is constructed in a similar manner to the conventional portable telephone 1 except the constitution of a frequency error correction block 31. The portable telephone 30 receives a signal which is subjected to the spectrum diffusion and modulation process with the PN code and transmitted through the antenna 2, and inputs the reception signal S1 to the reception part 3. The reception part 3 performs a predetermined signal process such as a frequency conversion on the reception signal S1, and outputs the reception signal S2 obtained as a result to the multiplier 4.

The multiplier 4 multiplies the PN code S3 supplied from the PN code generator 5 by the reception signal S2 in order to perform the inverse diffusion, and outputs the reception signal S4 thus obtained to the decoding part 6 and the frequency error correction block 31. The decoding part 6 performs the decoding process on the reception signal S4 in order to generate the baseband signal S5 and outputs the baseband signal S5 to the subsequent circuit (not shown).

The frequency error correction block 31 is designed to input the reception signal S4 to the frequency error detection part 8. The frequency error detection part 8 detects the frequency error between the reception signal S2 and the PN code S3 from the reception signal S4 which has been multiplied by the PN code S3, and outputs the frequency error to a PDM part 32 as the frequency error data SE. The PDM part 32 performs the pulse density modulation process on the frequency error data SE based on the clock signal S7 supplied from a frequency divider 33 in order to generate the PDM waveform data. Further, the PDM part 32 corrects the generated PDM waveform data based on a clock correction signal S30 supplied from the frequency divider 33 and outputs PDM waveform correction data SK thus obtained to the LPF 11.

The LPF 11 extracts the direct current component from the PDM waveform correction data SK to generate the control voltage S9 and outputs the control voltage S9 to the VCXO 12. The VCXO 12 generates the transmission signal S10 while changing the transmission frequency in accordance with the supplied control voltage S9, and outputs the transmission signal S10 to the frequency divider 33. The frequency divider 33 divides the frequency of the transmission signal S10 in accordance with the predetermined number of frequency divisions so as to generate the clock signal S7, and outputs the clock signal S7 to the PN code generator 5 and the PDM part 32. Moreover, the frequency divider 33 generates the clock correction signal S30 showing the phase of the unequal, cycle component included in the generated clock signal S7, and outputs the clock correction signal S30 to the PDM part 32. The PN code generator 5 generates the PN code S3 based on the clock signal S7 supplied from the frequency divider 33 and outputs the PN code S3 to the multiplier 4.

In such a way, the frequency error correction block 31 generates the clock signal S7 based on the reception signal, S4 which has been multiplied by the PN code S3, and supplies the clock signal S7 to the PN code generator 5. Thereby, the frequency of the PN code S3 generated by the PN code generator 5 is controlled so as to correspond to the frequency of the PN code of the transmission side included in the reception signal S2.

Figure 2:
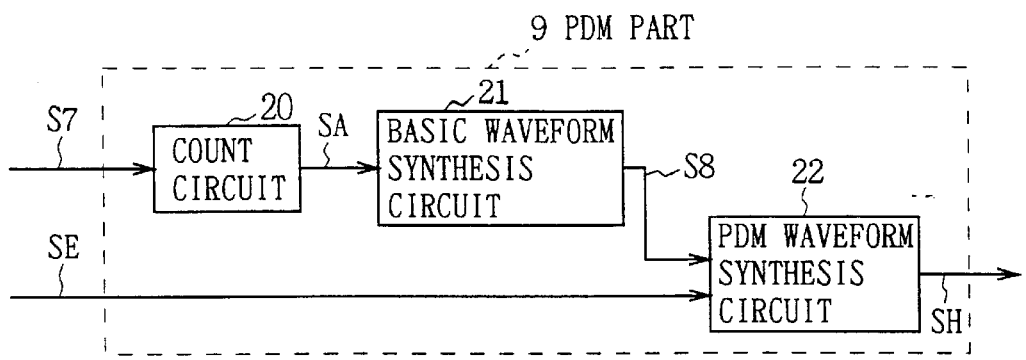
FIG. 2 is a block diagram showing the constitution of a PDM part.
Figure 3:
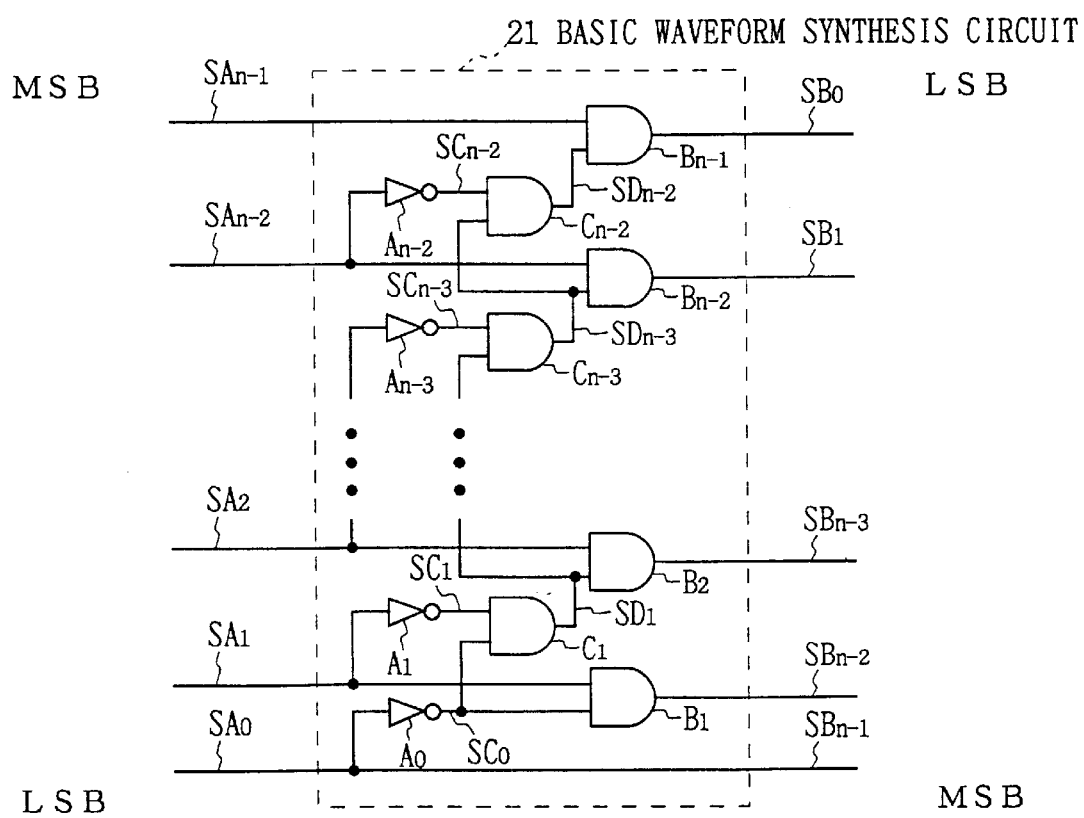
FIG. 3 is a block diagram showing the constitution of a basic waveform synthesis circuit.
Figure 4:
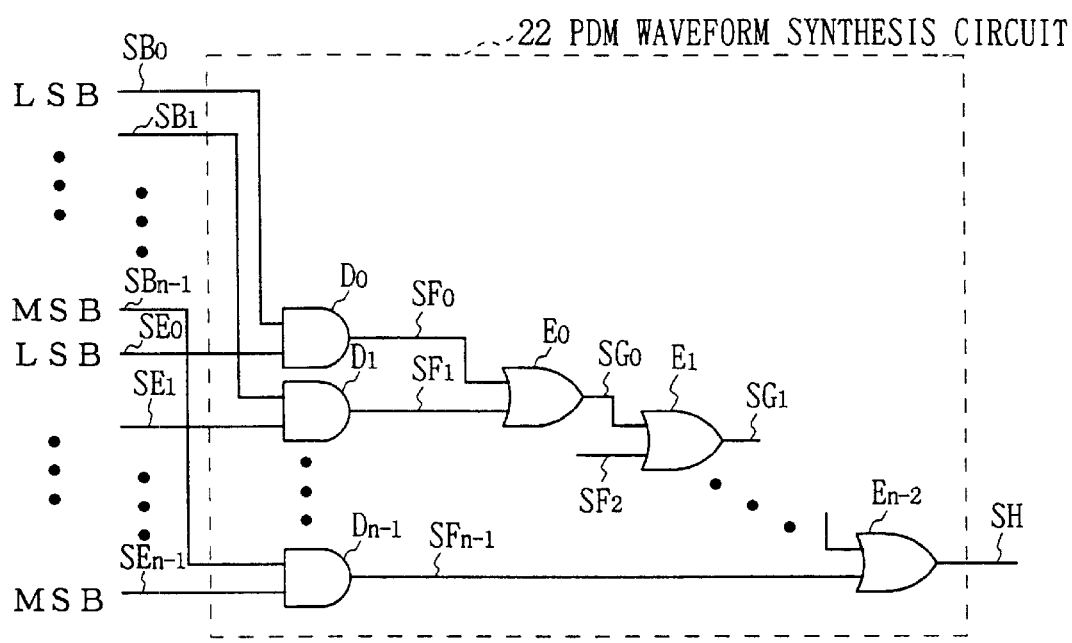
FIG. 4 is a block diagram showing the constitution of a PDM waveform synthesis circuit.
Figure 10:
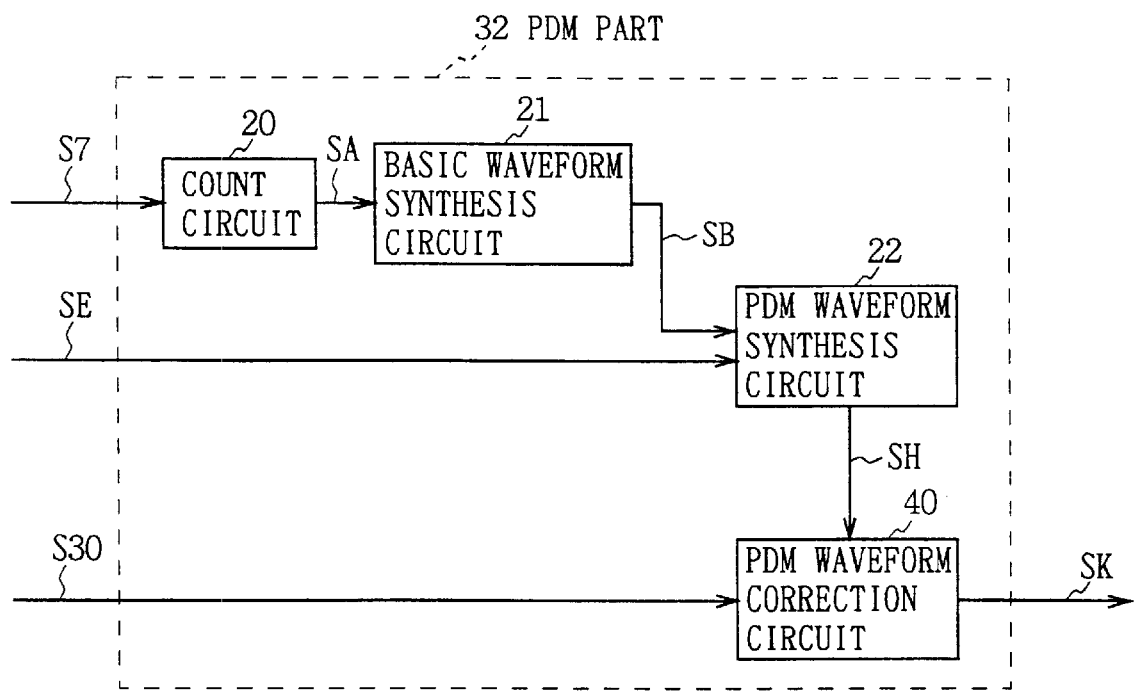
FIG. 10 is a block diagram showing the constitution of a PDM part.

In FIG. 10, parts corresponding to those in FIG. 2 are denoted by the same reference numerals as those in FIG. 2, wherein the PDM part 32 comprises the count circuit 20, the basic waveform synthesis circuit 21, the PDM waveform synthesis circuit 22 and a PDM waveform correction circuit 40. The clock signal S7 is supplied from the frequency divider 33 (FIG. 9) to the count circuit 20. The count circuit 20 composed of the binary count circuit of "n" bits counts the clock signal S7 to generate the count data SA of "n" bits and outputs the count data SA to the basic waveform synthesis circuit 21.

The basic waveform synthesis circuit 21 generates data having a timing, in which the count data SA of a desired bit becomes the logical level "H" and the bit data SA of all bits less significant than the desired bit become the logical level "L", as the logical level "H". The basic waveform synthesis circuit 21 sequentially replaces more significant bits of the data by less significant bits in order to generate the basic waveform data SB and outputs the basic waveform data SB to the PDM waveform synthesis circuit 22. The PDM waveform synthesis circuit 22 takes the AND of the frequency error data SE supplied from the frequency error detection part 8 (FIG. 9) and the basic waveform data SB and then, takes the OR of them to generate the PDM waveform data SH and outputs the PDM waveform data SH to the PDM waveform correction circuit 40.

Figure 11:
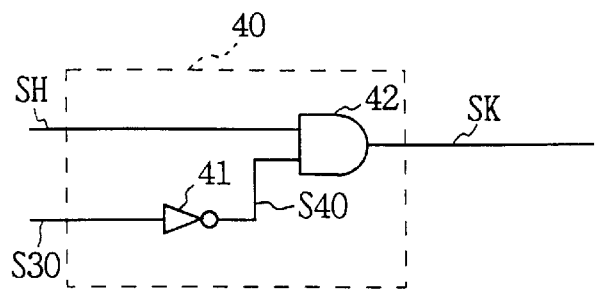
FIG. 11 is a block diagram showing the constitution of a PDM waveform correction circuit.

The PDM part 32 is designed to input the clock correction signal S30 supplied from the frequency divider 33 (FIG. 9) to the PDM waveform correction circuit 40. As illustrated in FIG. 11, the PDM waveform correction circuit 40 comprises an inverter 41 and an AND circuit 42, inputs the clock correction signal S30 to the inverter 41 and inputs the PDM waveform data SH to the AND circuit 42. The inverter 41 inverts the polarity of the clock correction signal S30 and outputs inverter output data S40 obtained as a result to the AND circuit 42. The AND circuit 42 takes the AND of the inverter output data S40 and the PDM waveform data SH, and outputs the PDM waveform correction data SK thus obtained to the LPF 11 (FIG. 9).

Now, a case in which the clock signal S7 including the unequal cycle component is inputted to the PDM part 32 is explained. For instance, it is assumed that the clock signal S7 to be inputted to the count circuit 20 of "3" bits is slowed before the rise timings of the "fourth", the "sixth" and the "eighth" clocks of its "one" cycle (FIG. 5A).

Figures 5A, 5B, 5C, 5D:
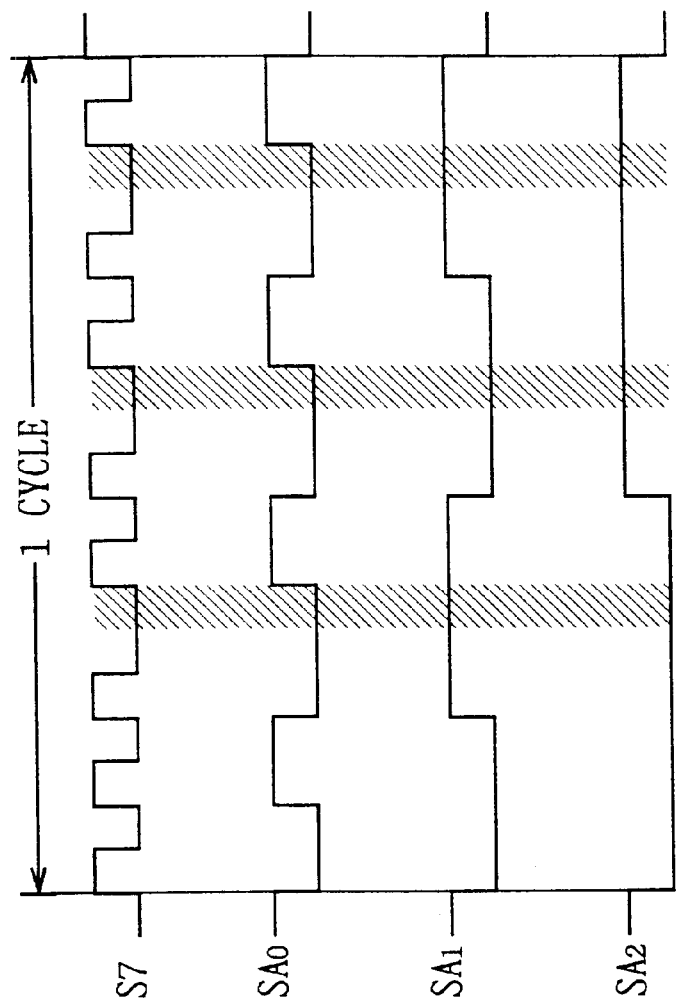
FIGS. 5A to 5D are charts showing the relation between a clock signal and count data.
Figure 8:
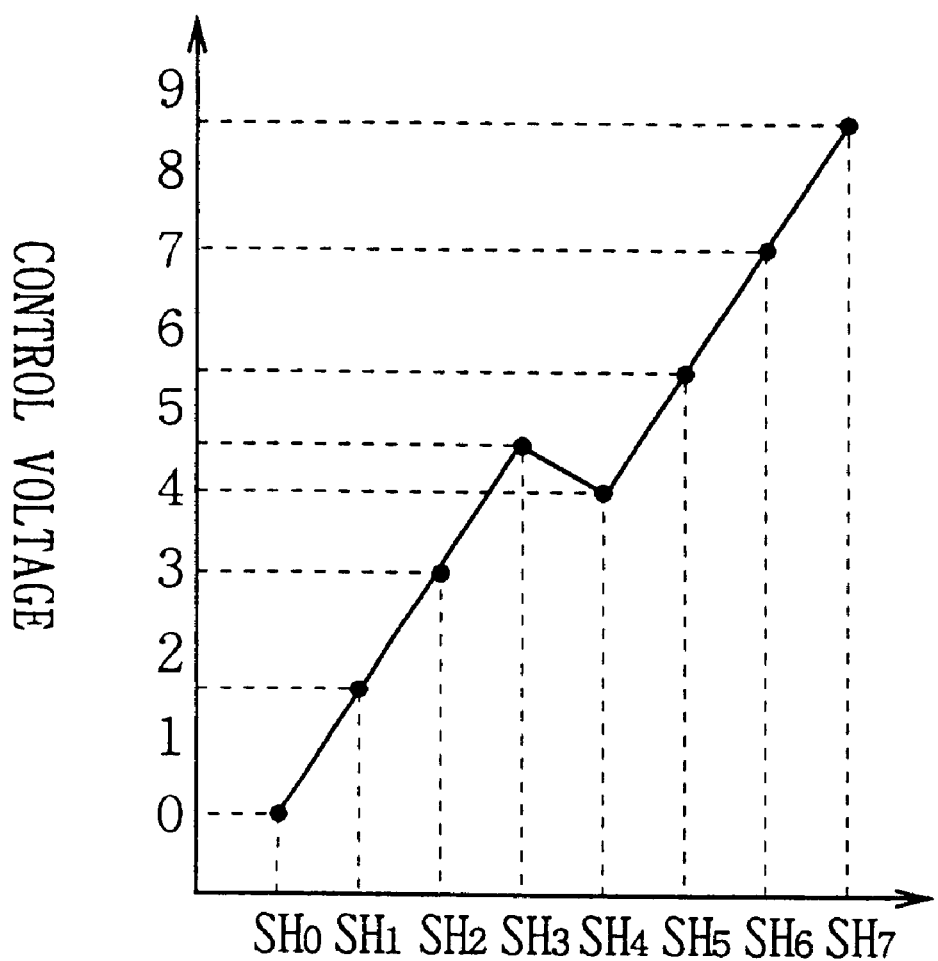
FIG. 8 is a chart showing the relation between the PDM waveform data and control voltage.

The count circuit 20 counts up the clocks synchronizing with the rise timing of the clock so as to generate the count data $SA_0$ to $SA_2$ of "3" bits, and outputs the count data $SA_0$ to $SA_2$ to the basic waveform synthesis circuit 21 (FIGS. 5B to 5D). The basic waveform synthesis circuit 21 performs the predetermined data process described above on the count bit data $SA_0$ to $SA_2$ and outputs the basic waveform data $SB_0$ to $SB_2$ thus obtained to the PDM waveform synthesis circuit 22 (FIGS. 6B to 6D). The PDM waveform synthesis circuit 22 synthesizes the basic waveform data $SB_0$ to $SB_2$ in accordance with the supplied frequency error data SE and outputs the PDM waveform data SH obtained as a result to the PDM waveform correction circuit 40 (FIGS. 7B to 7I).

The frequency divider 33 (FIG. 9) generates the clock correction signal S30 indicating the phase of the unequal cycle component included in the clock signal S7 as well as the clock signal S7 and supplies the clock correction signal S30 to the PDM waveform correction circuit 40. For example, as shown in FIG. 12A, in the case where the clock signal S7 which is slowed before the rise timings of the "fourth", the "sixth" and the "eighth" clocks is generated, the frequency divider 33 generates the clock correction signal S30 in which halves of the clocks just before their rise timings have logical levels "H".

In the case where the PDM waveform data $SH_0$ of the waveform number "0" is supplied to the PDM waveform correction circuit 40, the PDM waveform correction circuit 40 generates the PDM waveform correction data $SK_0$ of the waveform number "0" with the logical level "0" and outputs the PDM waveform correction data $SK_0$ to the LPF 11 (FIG. 9) (see FIG. 12B). Further, in the case where the PDM waveform data $SH_1$ of the waveform number "1" is supplied to the PDM waveform correction circuit 40, the PDM waveform correction circuit 40 drops a half of the clock just before the rise timing of the "sixth" clock of the PDM waveform data $SH_1$ from the logical level "H" to the logical level "L", and thereby generates the PDM waveform correction data $SK_1$ of the waveform number "1" and outputs it (see FIG. 12C).

In the case where the PDM waveform data $SH_2$ of the waveform number "2" is supplied to the PDM waveform correction circuit 40, the PDM waveform correction circuit 40 drops halves of the clocks just before the rise timings of the "fourth" and the "eighth" clocks of the PDM waveform data $SH_2$ from the logical level "H" to the logical level "L", so that it generates the PDM waveform correction the data $SK_2$ of the waveform number "2" and outputs it (see FIG. 12D). Further, in the case where the PDM waveform data $SH_3$ of the waveform number "3" is supplied to the PDM waveform correction circuit 40, the PDM waveform correction circuit 40 drops halves of the clocks just before the rise timings of the "fourth", the "sixth" and the "eighth" clocks of the PDM waveform data $SH_3$ from the logical level "H" to the logical level "L", and thereby it generates the PDM waveform correction data $SK_3$ of the waveform number "3" and outputs it (see FIG. 12E).

In the case where the PDM waveform data $SH_4$ of the waveform number "4", is supplied to the PDM waveform correction circuit 40, the PDM waveform correction circuit 40 outputs the PDM waveform data $SH_4$ as the PDM waveform correction data $SK_4$ of the waveform number "4" (see FIG. 12F). In addition, in the case where the PDM waveform data $SH_5$ of the waveform number "5" is supplied to the PDM waveform correction circuit 40, the PDM waveform correction circuit 40 drops a half of the clock just before the rise timing of the "sixth" clock of the PDM waveform data $SH_5$ from the logical level "H" to the logical level "L", so that it generates the PDM waveform correction data $SK_5$ of the waveform number "5" and outputs it (see FIG. 12G).

Subsequently, in the case where the PDM waveform data $SH_6$ of the waveform number "6" is supplied to the PDM waveform correction circuit 40, the PDM waveform correction circuit 40 drops halves of the clocks just before the rise timings of the "fourth" and the "eighth" clocks of the PDM waveform data $SH_6$ from the logical level "H" to the logical level "L", and thereby generates the PDM waveform correction data $SK_6$ of the waveform number "6" and outputs it (see FIG. 12H). Furthermore, in the case where the PDM waveform data $SH_7$ of the waveform number "7" is supplied to the PDM waveform correction circuit 40, the PDM waveform correction circuit drops halves of the clocks just before the rise timings of the "fourth", "the sixth" and the "eighth" clocks of the PDM waveform data $SH_7$ from the logical level "H" to the logical level "L", and thereby generates the PDM waveform correction data $SK_7$ of the waveform number "7" and outputs it (see FIG. 12I).

As mentioned above, the PDM waveform correction circuit 40 forcedly drops the logical level "H" to the logical level "L" for a period corresponding to the unequal cycle component of the clock signal S7 among the PDM waveform data SH based on the supplied clock correction signal S30, and thereby generates the PDM waveform correction data SK in which an influence by the unequal cycle component is removed and outputs it to the LPF 11. The LPF 11 extracts the direct current component from the PDM waveform correction data SK generated by the PDM part 32, and thereby generates the control voltage S9 with the desired voltage level corresponding to the PDM waveform correction data SK and outputs the control voltage S9 to the VCXO 12.

FIG. 13 shows the relation between the PDM waveform correction data SK and the control voltage S9. In this case, since the control voltage S9 increases linearly according to the waveform number of the PDM waveform correction data SK, it can be understood that a linearity is established between the waveform number of the PDM waveform correction data SK and the control voltage S9. Therefore, the control voltage S9 outputted from the LPF 11 increases linearly, as the frequency error data SE supplied from the frequency error detection part 8 undergoes the increment process.

With the constitution mentioned above, the frequency divider 33 generates the clock signal S7 based on the transmission signal S10 supplied from the VCXO 12 and outputs the clock signal S7 to the count circuit 20 of the PDM part 32. Further, the frequency divider 33 generates the clock correction signal S30 indicating the phase of the unequal cycle component included in the clock signal S7 and outputs the clock correction signal S30 to the PDM waveform correction circuit 40 of the PDM part 32.

The count circuit 20 counts the clock signal S7 to generate the count data $SA_0$ to $SA_{n-1}$ of "n" bits and outputs the count data to the basic waveform synthesis circuit 21. The basic waveform synthesis circuit 21 synthesizes the count data $SA_0$ to $SA_{n-1}$ of "n" bits to generate "n" pieces of the basic waveform data $SB_0$ to $SB_{n-1}$ and outputs the basic waveform data to the PDM waveform synthesis circuit 22. The PDM waveform synthesis circuit 22 synthesizes the "n" pieces of the basic waveform data $SB_0$ to $SB_{n-1}$ based on the frequency error data SE supplied from the frequency error detection part 8 to generate the PDM waveform data SH and outputs the PDM waveform data SH to the PDM waveform correction circuit 40.

The PDM waveform correction circuit 40 forcedly sets the signal level of the phase corresponding to the unequal cycle component of the clock signal S7 among the PDM waveform data SH to the logical level "L" based on the supplied clock correction signal S30, and thereby generates the PDM waveform correction data SK and outputs the PDM waveform correction data SK to the LPF 11. The LPF 11 extracts the direct current component from the PDM waveform correction data SK to generate the control voltage S9 and outputs the control voltage S9 to the VCXO 12.

As mentioned above, since the PDM waveform correction circuit 40 is only provided at the subsequent stage of the PDM waveform synthesis circuit 22 so that the linearity can be achieved between the PDM waveform correction data SK and the control voltage S9 as the direct current component of the PDM waveform correction data SK, the VCXO 12 can be accurately controlled while the scale of a circuit or consumed power is avoided from being enlarged.

According to the above described constitution, the phase of the unequal cycle component of the PDM waveform data SH is corrected based on the clock correction signal S30 showing the phase of the unequal cycle component included in the clock signal S7 in order to generate the PDM waveform correction data, and therefore, the linearity can be established between the PDM waveform correction data and the direct current component thereof only by additionally providing the PDM waveform correction circuit 40. Thus, the VCXO 12 can be controlled with high accuracy while the scale of the circuit is prevented from being enlarged.

In the above described embodiment, a case is described where the PDM waveform correction circuit 40 is provided at the subsequent stage of the PDM waveform synthesis circuit 22 and the PDM waveform data SH is corrected by the PDM waveform correction circuit 40. However, the present invention is not limited thereto. As shown in FIG. 14 in which parts corresponding to those in FIG. 10 are designated by the same reference numerals as those in FIG. 10, in the case where a count waveform correction circuit 51 is provided at the subsequent stage of the count circuit 20 and the count data SA is corrected by the count waveform correction circuit 51, a similar effect to the above-mentioned case can be obtained.

In this case, the count circuit 20 outputs the count data SA to the count waveform correction circuit 51. In this connection, the clock correction signal S30 is supplied from the frequency divider 33 (FIG. 9) to the count waveform correction circuit 51. The count waveform correction circuit 51 takes the AND of the data obtained by inverting the polarity of the clock correction signal S30 and the count data SA, and thereby corrects the signal level of a phase corresponding to the unequal cycle component of the clock signal S7 among the count data SA and outputs count waveform correction data SL thus obtained to the basic waveform synthesis circuit 21.

The basic waveform synthesis circuit 21 synthesizes the count waveform correction data SL to generate basic waveform correction data SM and outputs the basic waveform correction data SM to the PDM waveform synthesis circuit 22. The PDM waveform synthesis circuit 22 synthesizes the basic waveform correction data SM based on the frequency error data SE supplied from the frequency error detection part 8 (see FIG. 9), and thereby generates the PDM waveform correction data SK and outputs the PDM waveform correction data SK to the LPF 11 (see FIG. 9).

Now, referring to FIGS. 15A to 15E, a case in which the count circuit 20 is a binary count circuit of "3" bits and the clock signal S7 including the unequal cycle component is inputted to the count circuit 20 is explained. FIG. 15A shows the clock signal S7 inputted to the count circuit 20. FIG. 15B shows the clock correction signal S30 supplied to the count waveform correction circuit 51.

The count circuit 20 generates the count data $SA_0$ to $SA_2$ by counting the clock signal S7 and outputs the count data to the count waveform correction circuit 51 (refer to FIGS. 5B to 5D). The count waveform correction circuit 51 takes the AND of the data obtained by inverting the polarity of the clock correction signal S30 and the bit data $SA_0$ to $SA_2$, and thereby generates count waveform correction data $SL_0$ to $SL_2$ and outputs the count waveform correction data to the basic waveform synthesis circuit 21 (see FIGS. 15C to 15E). In such a way, the count waveform correction circuit 51 drops the signal level of a phase corresponding to the unequal cycle component of the clock signal S7 among the count data $SA_0$ to $SA_2$ from the logical level "H" to the logical level "L", and thereby corrects the count data $SA_0$ to $SA_2$.

As mentioned above, a PDM part 50 is designed to correct the count data SA by the count waveform correction circuit 51 in order to generate the corrected PDM waveform correction data SK. Accordingly, only the count waveform correction circuit 51 is additionally provided, the linearity can be established between the PDM waveform correction data and the direct current component thereof. Thus, the increase of the scale of the circuit is suppressed and the VCXO 12 can be precisely controlled.

In the above described embodiment, a case is described where the PDM waveform correction circuit 40 is provided at the subsequent stage of the PDM waveform synthesis circuit 22 and the PDM waveform data SH is corrected by the PDM waveform correction circuit 40. However, the present invention is not limited thereto. As illustrated in FIG. 16 in which parts corresponding to those in FIG. 10 are denoted by the same reference numerals as those in FIG. 10, in the case where a basic waveform correction circuit 61 is provided at the subsequent stage of the basic waveform synthesis circuit 21 and the basic waveform data SB is corrected by the basic waveform correction circuit 61, a similar effect to the above-mentioned case can be obtained.

In this case, the basic waveform synthesis circuit 21 outputs the basic waveform data SB to the basic waveform correction circuit 61. In this connection, the clock correction signal S30 is supplied from the frequency divider 33 (FIG. 9) to the basic waveform synthesis circuit 61. The basic waveform correction circuit 61 takes the AND of the data obtained by inverting the polarity of the clock correction signal S30 and the basic waveform data SB and thereby corrects the signal level of a phase corresponding to the unequal cycle component of the clock signal S7 among the basic waveform data SB, and outputs the basic waveform correction data SM thus obtained to the PDM waveform synthesis circuit 22. The PDM waveform synthesis circuit 22 synthesizes the basic waveform correction data SM based on the frequency error data SE supplied from the frequency error detection part 8 (FIG. 9), and thereby generates the PDM waveform correction data SK and outputs the PDM waveform correction data to the LPF 11 (FIG. 9).

Now, referring to FIGS. 17A to 17E, a case in which the count circuit 20 is the binary count circuit of "3" bits and the clock signal S7 including the unequal cycle component is inputted to the count circuit 20 is explained. FIG. 17A shows the clock signal S7 inputted to the count circuit 20. FIG. 17B shows the clock correction signal S30 supplied to the basic waveform correction circuit 61.

The basic waveform synthesis circuit 21 synthesizes the count data $SA_0$ to $SA_2$ and thereby generates the basic waveform data $SB_0$ to $SB_2$ and outputs the basic waveform data to the basic waveform correction circuit 61 (refer to FIGS. 6B to 6D). The basic waveform correction circuit 61 takes the AND of the data obtained by inverting the polarity of the clock correction signal S30 and the basic waveform data $SB_0$ to $SB_2$ and thereby generates the basic waveform correction data $SM_0$ to $SM_2$, and outputs the basic waveform correction data to the PDM waveform synthesis circuit 22 (FIGS. 17C to 17E). As described above, the basic waveform correction circuit 61 drops the signal level of a phase corresponding to the unequal cycle component of the clock signal S7 among the basic waveform data $SB_0$ to $SB_2$ from the logical level "H" to the logical level "L", so that the basic waveform correction circuit 61 corrects the basic waveform data $SB_0$ to $SB_2$.

As mentioned above, a PDM part 60 is designed to correct the basic waveform data SB with the basic waveform correction circuit 61 in order to generate the corrected PDM waveform correction data SK. Accordingly, only the basic waveform correction circuit 61 is added, the linearity can be realized between the PDM waveform correction data SK and the direct current component thereof. Thus, while the scale of the circuit is prevented from increasing, the VCXO 12 can be accurately controlled.

Further, in the above-described embodiment, a case is described where the PDM waveform correction circuit 40 comprises the inverter 41 and the AND circuit 42. However, the present invention is not limited thereto, but in the case where a PDM waveform correction circuit 70 is formed with an OR circuit 71, the same effect can be obtained in the above example. In this case, the OR circuit 71 takes the OR of the PDM waveform data SH outputted from the PDM waveform synthesis circuit 22 and the clock correction signal S30 supplied from the frequency divider 33 (FIG. 9), and then outputs PDM waveform correction data SQ obtained as a consequence to the LPF 11 (FIG. 9).

Now, with reference to FIGS. 19A to 19I, the PDM waveform correction data SQ is explained in the case where the count circuit 20 is the binary count circuit of "3" bits and the clock signal S7 including the unequal cycle component is inputted to the count circuit 20. FIG. 19A shows the clock correction signal S30. When the PDM waveform data $SH_0$ of the waveform number "0" is supplied to the PDM waveform correction circuit 70, the PDM waveform correction circuit 70 raises halves of the clocks just before the rise timings of the "fourth", the "sixth" and the "eighth" clocks from the logical level "L" to the logical level "H", and thereby generates PDM waveform correction data $SQ_0$ of the waveform number "0" (see FIG. 19B) and outputs it.

When the PDM waveform data $SH_1$ of the waveform number "1" is supplied to the PDM waveform correction circuit 70, the PDM waveform correction circuit 70 raises halves of the clocks just before the rise timings of the "fourth" and the "eighth" clocks from the logical level "L" to the logical level "H", and thereby generates PDM waveform correction data $SQ_1$ of the waveform number "1" (see FIG. 19C) and outputs it. Further, when the PDM waveform data $SH_2$ of the waveform number "2" is supplied to the PDM waveform correction circuit 70, the PDM waveform correction circuit 70 raises a half of the clock just before the rise timing of the "sixth" clock from the logical level "L" to the logical level "H", and thereby generates PDM waveform correction data $SQ_2$ of the waveform number "2", and outputs it (see FIG. 19D).

When the PDM waveform data $SH_3$ of the waveform number "3" is supplied to the PDM waveform correction circuit 70, the PDM waveform correction circuit 70 outputs the PDM waveform data $SH_3$ as PDM waveform correction data $SQ_3$ of the waveform number "3" (see FIG. 19E). Further, when the PDM waveform data $SH_4$ of the waveform number "4" is supplied to the PDM waveform correction circuit 70, the PDM waveform correction circuit 70 raises halves of the clocks just before the rise timings of the "fourth", the "sixth" and the "eighth" clocks from the logical level "L" to the logical level "H", and thereby generates PDM waveform correction data $SQ_4$ of the waveform number "4" and outputs it (see FIG. 19F).

When the PDM waveform data $SH_5$ of the waveform number "5" is supplied to the PDM waveform correction circuit 70, the PDM waveform correction circuit 70 raises halves of the clocks just before the rise timings of the "fourth" and the "eighth" clocks from the logical level "L" to the logical level "H", hence it generates PDM waveform correction data $SQ_5$ of the waveform number "5" and outputs it (see FIG. 19G). Further, when the PDM waveform data $SH_6$ of the waveform number "6" is supplied to the PDM waveform correction circuit 70, the PDM waveform correction circuit 70 raises a half of the clock just before the rise timing of the "sixth" clock from the logical level "L" to the logical level "H", so that it generates PDM waveform correction data $SQ_6$ of waveform number "6" and outputs it (see FIG. 19H). Furthermore, when the PDM waveform data $SH_7$ of the waveform number "7" is supplied to the PDM waveform correction circuit 70, the PDM waveform correction circuit 70 outputs the PDM waveform data $SH_7$ as PDM waveform correction data $SQ_7$ of the waveform number "7" (see FIG. 19I).

As mentioned above, the PDM waveform correction circuit 70 forcedly raises a phase corresponding to the unequal cycle component of the clock signal S7 among the PDM waveform data SH from the logical level "L" to the logical level "H" based on the supplied clock correction signal S30, so that the PDM waveform correction circuit 70 generates the PDM waveform correction data SQ in which the influence by the unequal cycle component is removed and outputs the data SQ to the LPF 11. The LPF 11 extracts the direct current component from the PDM waveform correction data SQ to generate control voltage and outputs the control voltage to the VCXO 12.

Figure 20:
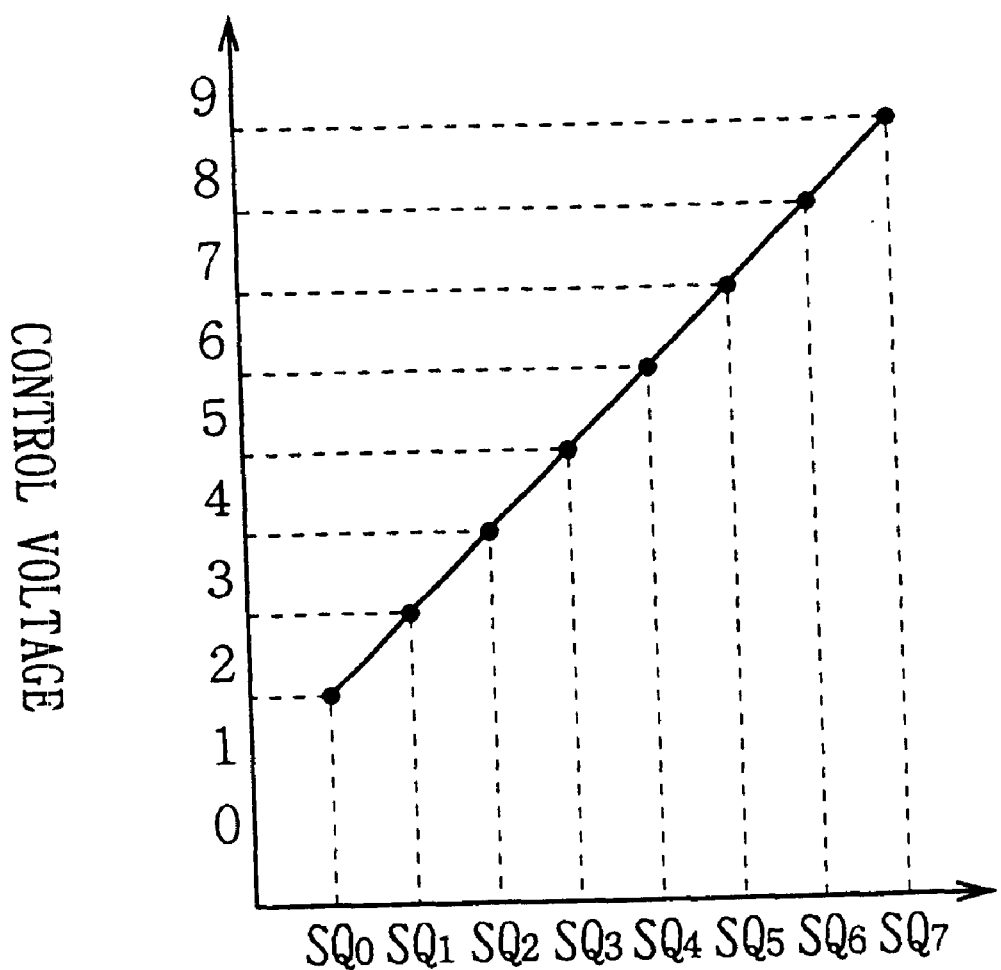
FIG. 20 is a chart showing the relation between the PDM waveform correction data and the control voltage.

FIG. 20 shows the relation between the PDM waveform correction data SQ and the control voltage. In this case, the control voltage increases linearly interlocking with the waveform number of the PDM waveform correction data SQ. Thus, it can be understood that the linearity is established between the waveform number of the PDM waveform correction data SQ and the control voltage.

In such a way, if the PDM waveform correction data SQ is generated by correcting the phase of the unequal cycle component of the PDM waveform data SH based on the clock correction signal S30 showing the phase of the unequal cycle component included in the clock signal S7, the linearity can be achieved between the PDM waveform correction data SQ and the direct current component thereof only by additionally providing the PDM waveform correction circuit 70. Thus, the VCXO 12 can be accurately controlled while the scale of the circuit is prevented from being enlarged.

In the above-described embodiments, a case is described where a pulse density per unit time is changed to carry out the modulation process. However, the present invention is not limited thereto, but in the case where a plurality of pulse trains within unit time is connected together and pulse width is changed so that the modulation process is performed, a similar effects to the above-mentioned cases can be obtained.

Further, in the above mentioned embodiments, a case is described where the present invention is applied to the PDM part 32 employed in the portable telephone 30 of the CDMA system. However, the present invention is not limited thereto, but can be applied to, in short, any pulse density modulator in which the pulse density per unit time is changed to carry out the modulation process. Also in this case, the same effects as those obtained in the above-described cases can be obtained.

According to the present invention described above, the waveform data correcting means is provided for correcting the pulse density modulated waveform data based on the clock correction signal showing the phase of the unequal cycle component included in the clock signal, and thereby the linearity can be established between the corrected pulse density modulated waveform data and the direct current component thereof only by additionally providing the waveform data correcting means. Accordingly, the pulse density modulation can be performed more accurately than a conventional pulse density modulator.

While there has been described in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A pulse density modulator for performing a modulation process by changing a pulse density per unit time, said pulse density modulator comprising:

counting means for counting supplied clock signals;

first waveform data generating means for synthesizing count data outputted from said counting means to generate basic waveform data having a variety of pulse signals;

second waveform data generating means for synthesizing said basic waveform data outputted from said first waveform data generating means to generate pulse density modulated waveform data according to digital data supplied thereto;

clock correction signal generating means for generating a clock correction signal having a pulse duration corresponding to a phase-shifted portion of a clock signal causing an unequal cycle of the supplied clock signals; and waveform data correcting means for correcting the pulse duration of said pulse density modulated waveform data based on said clock correction signal.

2. The pulse density modulator according to claim 1, wherein said waveform data correcting means corrects said pulse density modulated waveform data outputted from said second waveform data generating means based on said clock correction signal.

3. The pulse density modulator according to claim 1, wherein said waveform data correcting means corrects said count data outputted from said counting means based on said clock correction signal to correct said pulse density modulated waveform data.

4. The pulse density modulator according to claim 1, wherein said waveform data correcting means corrects said basic waveform data outputted from said first waveform data generating means based on said clock correction signal to correct said pulse density modulated waveform data.

5. The pulse density modulator according to claim 1, wherein said waveform data correcting means sets a signal level of the phase corresponding to an unequal cycle component included in said supplied clock signals of said pulse density modulated waveform data to a logical level L based on said supplied clock correction signal to correct said pulse density modulated waveform data.

6. The pulse density modulator according to claim 1, wherein said waveform data correcting means sets a signal level of the phase corresponding to an unequal cycle component included in said supplied clock signals of said pulse density modulated waveform data to a logical level H based on said supplied clock correction signal to correct said pulse density modulated waveform data.

* * * * *